(12) United States Patent
Yamada et al.

(10) Patent No.: US 6,576,518 B1
(45) Date of Patent: Jun. 10, 2003

(54) METHOD OF MANUFACTURING A MASK ROM SEMICONDUCTOR DEVICE

(75) Inventors: Junji Yamada, Gunma (JP); Yutaka Yamada, Gunma (JP); Junichi Ariyoshi, Mie (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/091,991

(22) Filed: Mar. 6, 2002

(30) Foreign Application Priority Data

Mar. 8, 2001 (JP) ........................................ 2001-064653
Apr. 11, 2001 (JP) ........................................ 2001-112352

(51) Int. Cl.⁷ .......................................... H01K 21/8246
(52) U.S. Cl. ........................................ 438/275; 438/278
(58) Field of Search ................................. 438/275–278

(56) References Cited

U.S. PATENT DOCUMENTS 5,378,649 A * 1/1995 Huang ......................... 438/278
6,326,269 B1 * 12/2001 Jeng et al. ................... 438/257

* cited by examiner

*Primary Examiner*—Jey Tsai
(74) *Attorney, Agent, or Firm*—Fish & Richardson PC

(57) ABSTRACT

Disclosed is a method of manufacturing a semiconductor device including a gate electrode on a semiconductor substrate through a gate insulated film; source/drain regions formed to be adjacent to the gate electrode; and an Al wiring formed through an interlayer insulating film covering the gate electrode, wherein impurity ions are implanted in a surface layer of the substrate using the Al wiring and a photoresist formed thereon as a mask, and wherein no photoresist is formed on the Al wiring arranged above regions in which the impurity ions are implanted in adjacent elements.

9 Claims, 11 Drawing Sheets

METHOD OF MANUFACTURING A MASK ROM SEMICONDUCTOR DEVICE

BACKGROUND OF THE INVENTION

This invention relates to a method of manufacturing a semiconductor device, and more particularly to a manufacturing technique of stabilizing an operation of writing information into each of elements which constitute a mask ROM (Read Only Memory).

In order to shorten the TAT (Turn Around Time) of a mask ROM, various techniques of ion-implanting for writing information (which is also referred to as "program write" or "ROM write") after an Al wiring has been formed are known. Referring to FIGS. 9A to 9D, an explanation will be given of a conventional manufacturing technique.

Step 1: As seen from FIG. 9A, using the technique of thermal oxidation or CVD, a pad oxide film 52 of a silicon oxide film having a thickness of 25 nm is formed on a P-type semiconductor substrate 51. The pad oxide film 52 is formed to protect the surface of the semiconductor substrate 51.

Next, a silicon nitride film 53 which is an oxidation-resistant film is formed on the entire surface. Thereafter, lengthy stripes of openings 53a for forming element isolation films 54 are formed in the silicon nitride film 53 in a direction perpendicular to a paper face of this drawing.

Step 2: As seen from FIG. 9B, using the technique of LOCOS with the silicon nitride film 53 as a mask, the semiconductor substrate 51 is oxidized to form element isolation films 54. At this time, oxide regions invades between the semiconductor substrate 51 and silicon nitride film 53 so that bird's beaks 54a are formed. Next, the silicon nitride film 53 and pad oxide film 52 are removed, and using the technique of thermal oxidation, a gate insulated film 55 having a thickness of 14 nm to 17 nm is formed. Using the technique of CVD, a poly-Si film having a thickness of 350 nm is formed, and phosphorus is doped to form an N-type conductive film 56.

Step 3: As seen from FIG. 9C, the conductive film 56 is etched in lengthy strips in a direction orthogonal to the element isolation films 54 (it should be noted that the etched region, which is in parallel to the paper face, is not illustrated) to form gate electrodes 56a, which serve as word lines. Using the gate electrodes 56a as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed. An interlayer insulating film 57 having a thickness of 500 nm of a silicon oxide film is formed on the entire surface. Al wirings 58 in lengthy strips, which serve as bit lines, are formed above the element isolation films 54, respectively in a direction perpendicular to the paper face. Until this step, the manufacturing process can be carried out irrespectively of what program should be written in the memory cell transistors. For this reason, the wafers can be previously manufactured. In this case, a silicon oxide film 59 serving as a protection film is formed on the entire surface.

Step 4: At the time when a program to be written is determined on receipt of a request from a customer, as seen from FIG. 9D, a photoresist 60 having openings 60a for writing a program for a mask ROM is formed. P type impurities such as boron are ion-implanted in the semiconductor substrate 51 immediately beneath the gate electrodes 56a by using the photoresist 60 as a mask so that predetermined memory cell transistors are depleted. Thus, the threshold voltages of the memory cell transistors are lowered so that a ROM data is written.

However, generally, the processing accuracy of the photoresist is low, e.g. 0.5 $\mu$m. Therefore, the openings 60a formed in the photoresist 60 provide a variation of 0.5 $\mu$n. Further, as described above, the element isolation film 54 has the bird's beak and hence is thinned at its end. Therefore, where there is a variation in the openings 60a, as seen from FIG. 10, as the case may be, implanted impurity ions penetrate the bird's beak 54a to reach the semiconductor substrate 51 beneath the element isolation film 54, surrounded by circle A. Where such elements are adjacent to each other, a leak current flowing below the element isolation film 54a, as indicated by arrow, occurs between the adjacent elements. This leads to poor element isolation. The improvement of the processing accuracy of the photoresist mask leads to a great increase in cost.

Further, in the semiconductor device incorporating various transistors having different withstand voltages, the thickness of the gate insulated film is set according to the various transistors. For example, where the gate insulated films having two kinds of film thicknesses are to be formed, a thick gate insulated film is once formed on the entire surface, and is etched at the area(s) where a thin gate insulated film is to be formed, and further the thin gate insulated film is formed again.

In this case, when the thick gate insulated film is etched away, the element isolation film will be shaved. During such a process, the thickness of the element isolation film at an ROM part gradually becomes thin.

In the process in which the ROM will be made later, ion-implantation for data write is executed to penetrate an interlayer insulating film, gate electrode and gate insulated film. Therefore, this must be carried out at high energy of 1 MeV to 3 MeV. The ion implantation at such high energy increases the lateral diffusion of implanted ions. This also leads to the poor element isolation as described.

Further, the apparatus for executing ion-implantation at such high energy is generally expensive, which results in an increase in cost.

For the reasons described above, in order to prevent the poor element isolation, the element isolation film must be set in a width larger than a processing limit so as to give sufficient allowance. In addition, it is difficult to thin the element isolation film, which hinders miniaturization. This is a first problem to be solved.

When the interlayer insulating film 57 is etched, the etching does not advance along the edge of the photoresist 60, the sectional shape of the opening is tapered toward the bottom. The ion-implanting in this state leads to inconvenience of poor write due to an etching remainder. This is the second problem to be solved.

In order to solve this problem, where the interlayer insulating film is etched using the photoresist as a mask to form a ROM write region, taking the narrowing of the ion-implanted region due to the tapered portion into consideration, the photoresist is formed so that the diameter of the opening is larger than that of the ion-implanted region.

Thus, the poor ROM write due to the etching remainder of the interlayer insulating film could be avoided.

The above method was suitable for the write for an element at an individual position. However, where the write is done for the regions of adjacent elements, this method gave rise to the following problem.

Specifically, as seen from FIGS. 11A and 11B, in order to carry out the ROM write for the regions where the elements to be written are adjacent, when interlayer insulating films 63, 62, 61 and a part of the interlayer insulating film 57 are etched using as a mask photoresist 64 (which has an opening 64*a* having a diameter (X2) wider than that (X1) of the ion-implanted region), a thin photoresist remains above the metallic wiring 58 arranged on such a region. Where the interlayer insulating films are etched using the thin photoresist as a mask, as the case may be, the photoresist and interlayer insulating films fall down. This is a cause of a poor product. Incidentally, FIG. 11A is a sectional view taken in line A—A in FIG. 11B showing a semiconductor device in a multi-layer wiring structure.

SUMMARY OF THE INVENTION

In view of the first problem described above, in accordance with this invention, the method of manufacturing a semiconductor device including a gate electrode on a semiconductor substrate through a gate insulated film; source/drain regions formed to be adjacent to the gate electrode; and a metallic wiring formed through an interlayer insulating film covering the gate electrode, wherein impurity ions are implanted in a surface layer of the substrate using the metallic wiring and a photoresist formed thereon as a mask, the method has a feature that no photoresist is formed on the metallic wiring arranged above regions in which the impurity ions are implanted in adjacent elements.

Further, the method of manufacturing a semiconductor device has a feature that the metallic wiring is formed in a multiple layer structure, an interlayer insulating film is removed using the photoresist as a mask to expose the metallic wiring at a lowermost layer, and ions are implanted using it as a mask.

Furthermore, the method of manufacturing a semiconductor device has a feature that the impurity ions are implanted to write information in each of elements constituting a mask ROM.

In this way, since the ions are implanted using as a mask the metallic wiring having higher processing accuracy than the photoresist, occurrence of poor element isolation can be inhibited unlike the background art.

Further, where ions are implanted in adjacent elements, no photoresist is formed on the metallic wiring arranged above the corresponding regions. For this reason, the fall-down of the photoresist itself or of both photoresist and its underlying interlayer insulating film in a multi-layer wiring structure due to its being thinned does not occur, which does not cause a poor product.

In view of the second problem, the method of manufacturing a semiconductor device including a gate electrode on a semiconductor substrate through a gate insulated film and source/drain regions formed to be adjacent to the gate electrode, wherein impurity ions are implanted in a surface layer of the substrate using a photoresist as a mask, the method has a feature that the impurity ions are implanted using the photoresist with openings which have different diameters between a region above an element to be ion-implanted and regions above adjacent elements to be ion-implanted.

Further, the method of manufacturing a semiconductor device has a feature that impurity ions are implanted in a surface layer of the substrate using the metallic wiring formed through an interlayer insulating film covering the gate electrode and a photoresist formed thereon as a mask.

Further, the method of manufacturing a semiconductor device has a feature that the metallic wiring is formed in a multiple layer structure, an interlayer insulating film is removed using the photoresist as a mask to expose the metallic wiring at a lowermost layer, and ions are implanted using it as a mask.

Furthermore, the method of manufacturing a semiconductor device has a feature that impurity ions are implanted to write information in each of elements constituting a mask ROM.

In this way, using as a mask the photoresist with openings having diameters corresponding to regions to be ion-implanted, ions are implanted in an element at an individual position or adjacent elements. For this reason, poor write for the element at an individual position is inhibited. In addition, the thinning of the photoresist above the regions where ions are implanted in the adjacent elements is reduced. For this reason, the fall-down of the photoresist itself or of both photoresist and its underlying interlayer insulating film in a multi-layer wiring structure due to its being thinned does not occur, which does not cause a poor product.

DETAILED DESCRIPTION OF THE PREFERRED EMBODIMENT

Figure 1A:
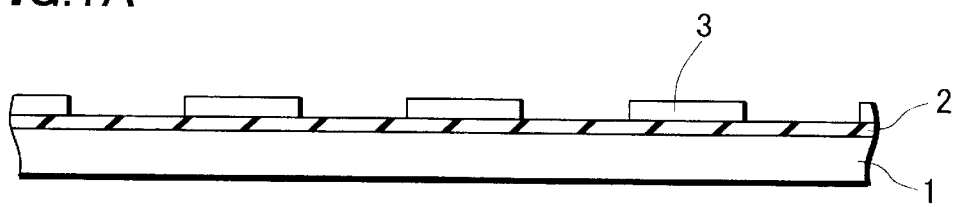
FIGS. 1A to 1C are sectional views for explaining a method of manufacturing a semiconductor device according to a first embodiment of this invention.

Now referring to the drawings, an explanation will be given of a first embodiment of a method of manufacturing a semiconductor device according to this invention.

Step 1: As seen from FIG. 1A, like the step 1 in the conventional manufacturing process, a pad oxide film 2 is formed on a semiconductor substrate 1 and a silicon nitride film 3 having openings is formed.

Figure 1B:
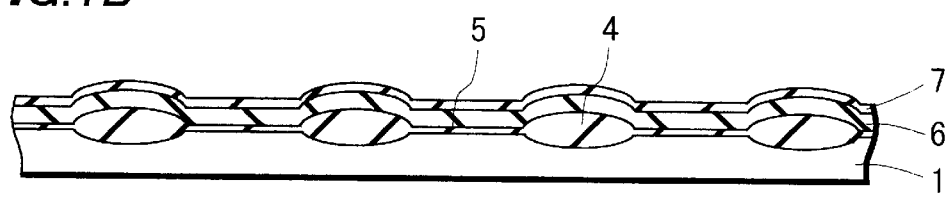

Step 2: As seen from FIG. 1B, using the technique of LOCOS with the silicon nitride film 3 as a mask, the semiconductor substrate 1 is oxidized to form element isolation films 4.

Next, the pad oxide film 2 and silicon nitride film 3 are removed, and using the technique of thermal oxidation, a gate insulated film 5 having a thickness of 14 nm to 17 nm is formed. Using the technique of CVD, a poly-Si film having a thickness of 100 nm is formed, and phosphorus is doped to form an N-type conductive film 6.

Further, a silicide film 7 of refractory metal such as tungsten having a thickness of 150 nm is formed. The silicide film 7, which constitutes a gate electrode together with the conductive film 6, serves to reduce the electric resistance of the gate electrode and protect the gate electrode as described later.

Figure 1C:
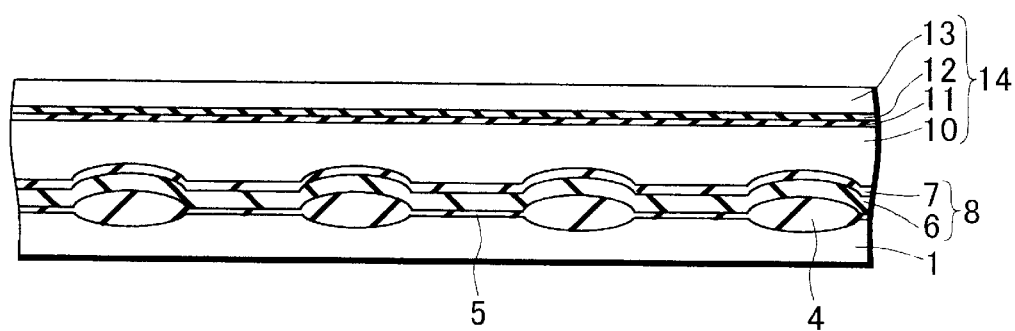

Step 3: As seen from FIG. 1C, the conductive film 6 and the silicide film 7 are etched in lengthy strips in a direction orthogonal to the element isolation films 4 (it should be noted that the etched region, which is in parallel to the paper face of this drawing, is not illustrated) to form gate electrodes 8, which serve as word lines.

Next, using the gate electrodes 8 as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed.

An interlayer insulating film 14 having a thickness of 600 nm and including a silicon oxide film 10, a silicon nitride film 11, a poly-Si film 12 and silicon oxide film 13 is formed on the entire surface by the technique of CVD. Now, the poly-Si film 12 serves as an etching stopper when the interlayer insulating film 14 is etched as described later.

Figure 2A:
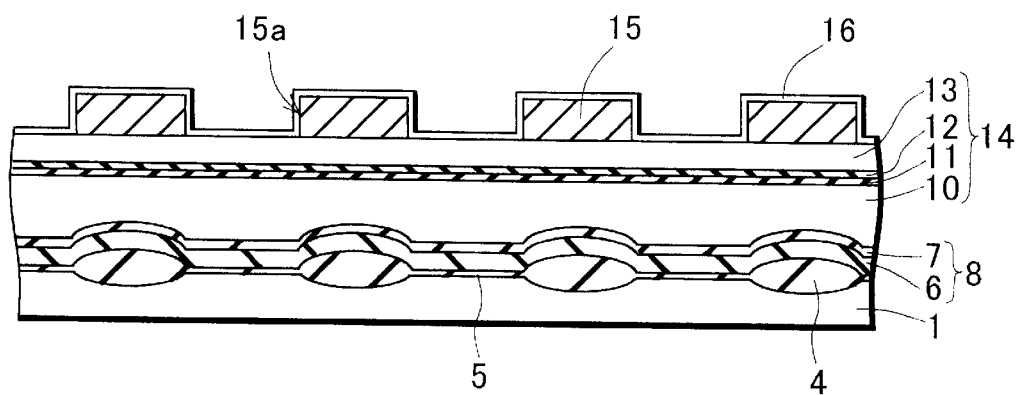
FIGS. 2A and 2B are sectional views for explaining a method of manufacturing a semiconductor device according to a first embodiment of this invention.

Step 4: As seen from FIG. 2A, a metallic film of an Al film is formed on the interlayer insulating film 14. The metallic film is patterned to form Al wirings 15 which serve as bit lines.

In this case, the Al wirings 15 are formed so that their edges are located immediately above those of the element isolation films 4, respectively. Until this step, the manufacturing process can be carried out irrespectively of what program should be written in the memory cell transistors. For this reason, the wafers can be previously manufactured. In this case, in order to protect the metallic wiring layer and prevent its corrosion, a protection film 16 of e.g. a silicon oxide film having a thickness of about 50 nm is formed on the entire surface.

Figure 2B:
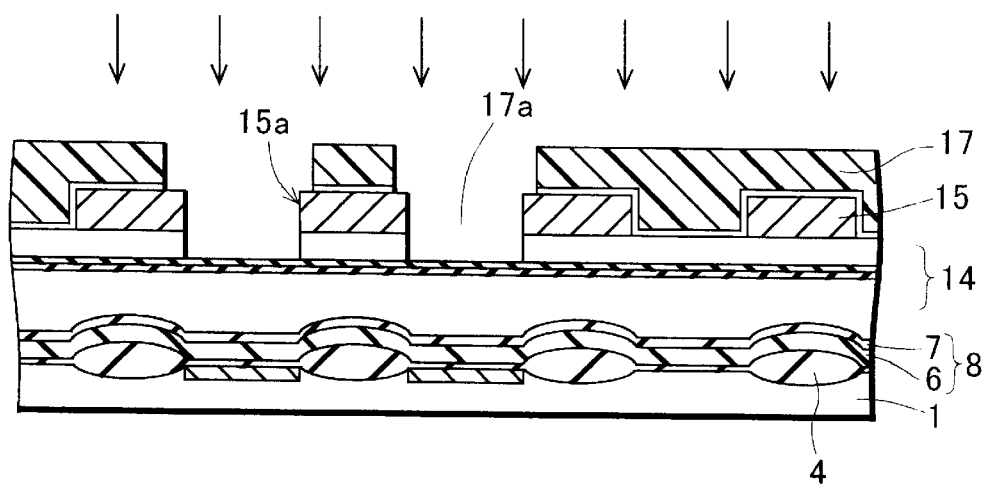

Step 5: At the time when a program to be written is determined on receipt of a request from a customer, as seen from FIG. 2B, a photoresist 17 having a thickness of about 1000 nmcis formed on the entire surface. The photoresist thus formed is subjected to light exposure and development to form openings 17a in the regions above prescribed memory cells. In this case, the opening 17a is made to have a larger area than that of the region to be ion-implanted so that the edges 15a of the Al wiring 15 are exposed. Next, using the photoresist 17 and the Al wiring 15 as a mask, the interlayer insulating film 14 is etched. The etching is anisotropic dry etching which leaves an interlayer insulating film 14 by 100 nm from the upper surface of the gate electrode.

P type impurities such as boron are ion-implanted in the semiconductor substrate 1 immediately beneath the gate electrode 8 from the openings 17a so that predetermined memory cell transistors are depleted. By using the Al wiring 15 whose edges are located immediately above the edges of the element isolation film 4, the ion-implanting can be carried out more precisely. Thus, the threshold voltages of the memory cell transistors are lowered so that a ROM data is written.

In addition, in accordance with this invention, in the write of the ROM data, since the metallic film (Al wiring 15) having higher processing accuracy than the conventional photoresist, unlike the background art, it is not necessary to give sufficient allowance in order to avoid occurrence of poor element isolation and to give the element isolation film a larger width than the processing limit. This permits microstructuring. Incidentally, the processing accuracy of the photoresist is e.g. 0.5 $\mu$m, whereas the processing accuracy of the metal film is e.g. 0.1 $\mu$m.

Since the interlayer insulating film 14 has been etched, the ion-implanting can be carried out at low energy of 130 keV to 160 keV. This prevents the lateral diffusion of implanted ions, and hence permits the ion-implanting with higher accuracy.

Through the steps described above, the mask ROM with a desired program is completed.

Now referring to the drawings, the second embodiment of the present invention is described below.

The feature of this embodiment resides in that where elements to be program-written are adjacent in the step of exposing the edges of the metallic wiring in the step 5 in the first embodiment, the metallic wiring within the region to be program-written is entirely exposed.

Specifically, in the first embodiment, where the photoresist used to form program-written regions is patterned, a predetermined space was located between the regions to be program-written. Therefore, a thin photoresist remains on the metallic wiring arranged within the regions where the elements to be program-written are adjacent.

Particularly, in the process adopting the two-layer wiring or three-layer wiring, where an opening is formed in the interlayer insulating film covering each wiring using the thin photoresist as a mask, as the case may be, the photoresist and interlayer insulating films fall down. This is a cause of a poor product.

In order to overcome such an inconvenience, in the second embodiment, no space is provided between the regions to be program-written which are adjacent.

Figure 3:
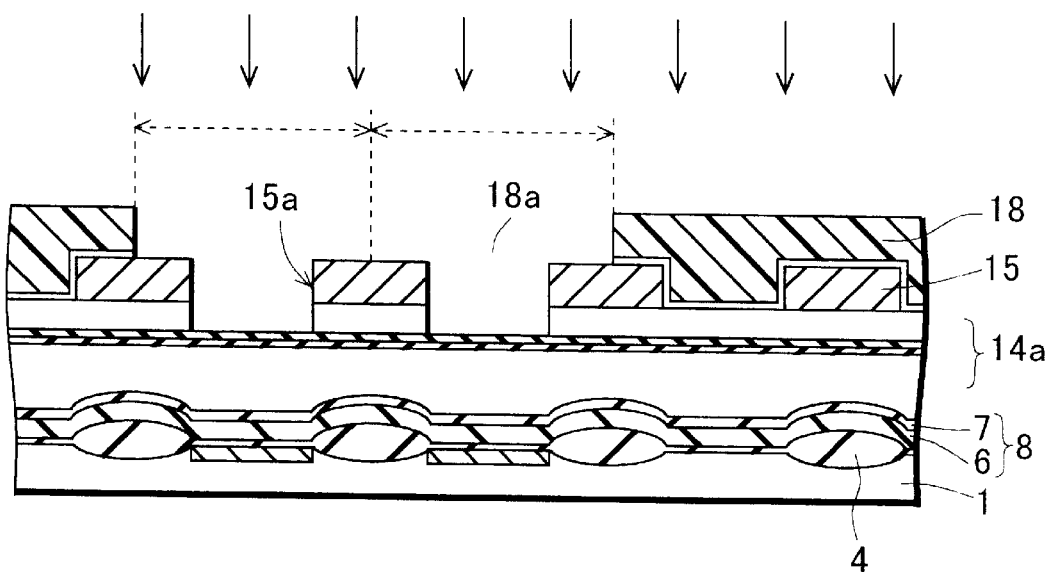
FIG. 3 is a sectional view for explaining a method of manufacturing a semiconductor device according to a second embodiment of this invention.

In FIG. 3, openings 18a are formed in a photoresist 18 so that the entire upper surface of the Al wiring 15 located above the regions (hatched portions) where the elements to be program-written are adjacent as shown is exposed.

Figure 4A:
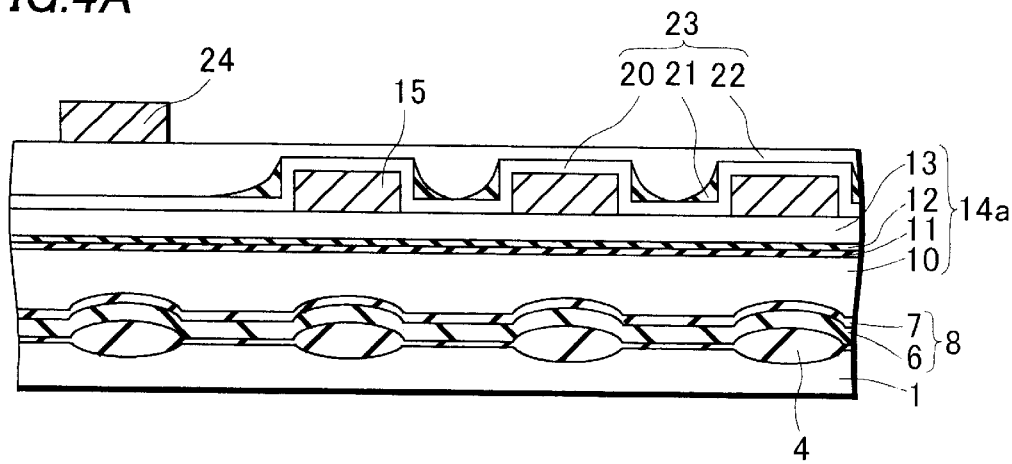
FIGS. 4A and 4B are sectional views for explaining a method of manufacturing a semiconductor device according to a third embodiment of this invention.
Figure 4B:
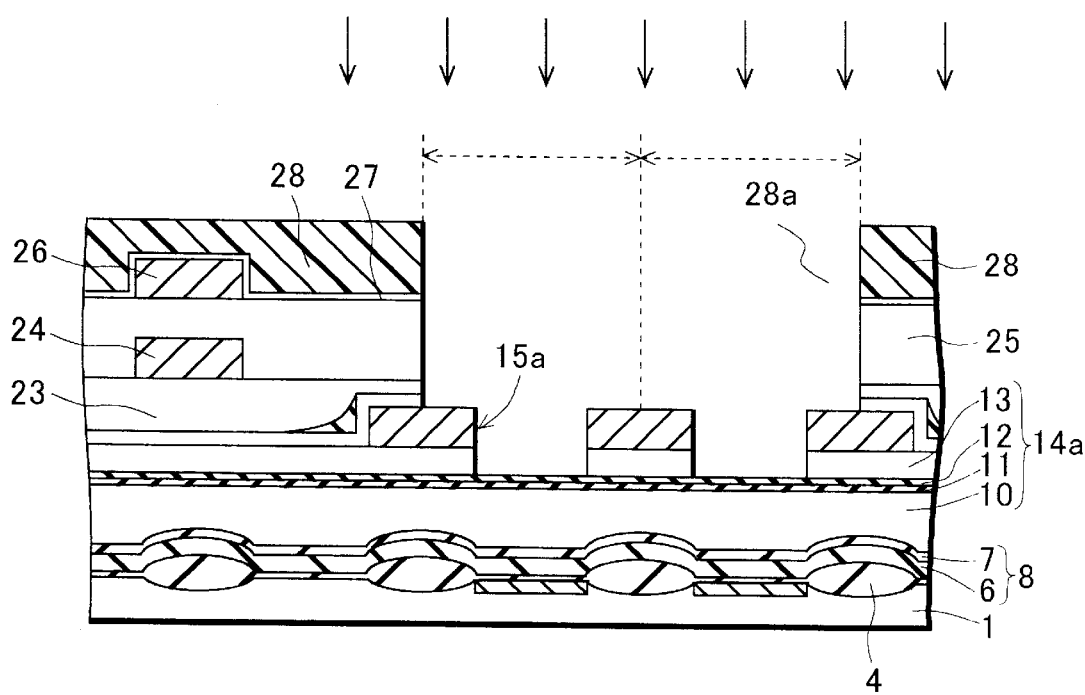

FIGS. 4A and 4B show the third embodiment in which this invention is applied to a method of manufacturing a semiconductor device in a multi-layer wiring structure. In FIG. 4, in order to avoid repetition of explanation, like reference symbols refer to like parts in the first and the second embodiment. FIG. 1 is also referred to for simplicity of explanation.

Step 1 : As seen from FIG. 1A, a pad oxide film 2 is formed on a semiconductor substrate 1 and a silicon nitride film 3 having openings is formed.

Step 2: As seen from FIG. 1B, with the silicon nitride film 3 as a mask, element isolation films 4 are formed. Thereafter, the pad oxide film 2 and silicon nitride film 3 are removed, and using the technique of thermal oxidation, a gate insulated film 5 having a thickness of 14 nm to 17 nm is formed.

Using the technique of CVD, a poly-Si film having a thickness of 100 nm is formed, and phosphorus is doped to form an N-type conductive film 6.

Further, a silicide film 7 of refractory metal such as tungsten having a thickness of 150 nm is formed.

Step 3: As seen from FIG. 1C, the conductive film 6 and the silicide film 7 are etched in lengthy strips in a direction orthogonal to the element isolation films 4 (it should be noted that the etched region, which is in parallel to the paper face, is not illustrated) to form gate electrodes 8, which serve as word lines.

Next, using the gate electrodes 8 as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed.

An interlayer insulating film 14a (FIG. 4) having a thickness of 600 nm and including a silicon oxide film 10, a silicon nitride film 11, a poly-Si film 12 and silicon oxide film 13 is formed on the entire surface by the technique of CVD.

Step 4: As seen from FIG. 4A, a metallic film of e.g, an Al film is formed on the interlayer insulating film 14a. The metallic film is patterned to form Al wirings 15 which serve as bit lines.

In this case, the Al wirings 15 are formed so that their edges 15a (FIGS. 2 and 3) are located immediately above those of the element isolation films 4, respectively.

For flattening of the surface, a second interlayer insulating film 23 having a thickness of 600 nm and including a silicon oxide film 20, an SOG film 21 and a silicon oxide film 22 is formed on the entire surface. A metallic film of an Al film is formed on the interlayer insulating film 23. The metallic film thus formed is patterned to form a second wiring 24.

Step 5: As seen from FIG. 4B, a third interlayer insulating film 25 having a thickness of 600 nm is formed on the entire surface so as to cover the second Al wiring 24. The metallic film thus formed is patterned to form a third Al wiring 26.

Until this step, the manufacturing process can be carried out irrespectively of what program should be written in the memory cell transistors. For this reason, the wafers can be previously manufactured. In this case, in order to protect the metallic wiring layer and prevent its corrosion, a protection film 16 of e.g. a silicon oxide film having a thickness of about 50 nm is formed on the surface.

Step 6: At the time when a program to be written is determined on receipt of a request from a customer, as seen from FIG. 2B, a photoresist 28 having a thickness of about 1000 nm is formed on the entire surface. The photoresist thus formed is subjected to light exposure and development to form openings 28a in the regions above prescribed memory cells.

In this case, the opening 28a are made to have a larger area than that of the region to be ion-implanted. For example, where a program is to be written in adjacent elements, the opening diameter of the photoresist is set so that the entire surface of the Al wiring 15 located above the regions of the adjacent elements can be exposed.

Using the photoresist 28 as a mask, the interlayer insulating films 25, 23 and 14a on the regions to be program-written are etched away. In this case, the etching is stopped on the poly-Si film 12.

Figure 5:
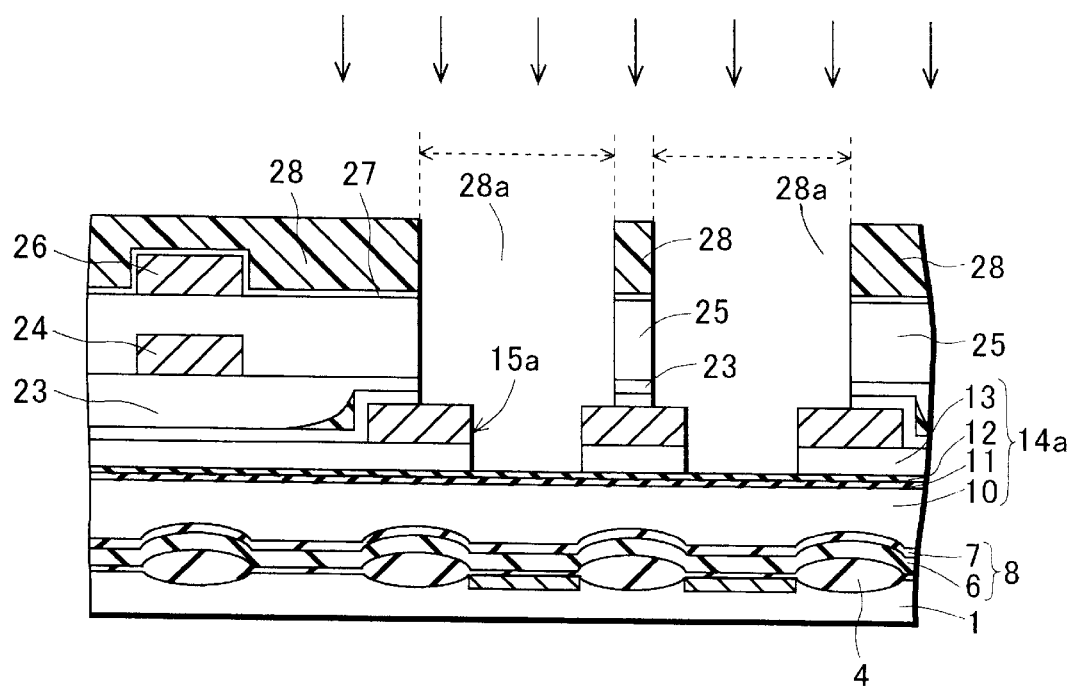
FIG. 5 is a sectional view for explaining a method of manufacturing a semiconductor device according to the third embodiment of this invention.

Incidentally, in order to compare the first embodiment and the third embodiment, FIG. 5 shows the case where the semiconductor device in a multiplayer wiring structure as shown in FIG. 4 is manufactured according to the first embodiment.

As seen from FIG. 5, in the first embodiment, where the adjacent elements are ion-implanted, the thin photoresist 28 remains on the Al wiring located above the corresponding regions.

Where the interlayer insulating films 25, 23 and 14a are etched using the photoresist 28 as a mask, as the case may be, the photoresist falls down. The interlayer insulating films 25 and 23 may also fall down together with the photoresist 28.

On the other hand, in accordance with the third embodiment, as shown in FIG. 4B, where the program is to be written in the adjacent elements, since no photoresist exists on the Al wiring located above the corresponding regions, when the interlayer insulating films 25, 23 and 14a are etched, the photoresist and the interlayer insulating films will not fall down. For this reason, the product can be manufactured in a stabilized process.

P type impurities such as boron are ion-implanted in the semiconductor substrate 1 immediately beneath the gate electrodes 8 from the openings 28a so that predetermined memory cell transistors are depleted. As described above, since the edges 15a of the Al wiring 15 are located immediately above those of the element isolation films 4, by using such an Al wiring as a mask, ion-implantation can be realized with higher accuracy. Thus, the threshold voltages of the memory cell transistors are lowered so that a ROM data is written.

In addition, in accordance with this invention, in the write of the ROM data, since the metallic film (Al wiring 15) having higher processing accuracy than the conventional photoresist, unlike the background art, it is not necessary to give sufficient allowance in order to avoid occurrence of poor element isolation and to give the element isolation film a larger width than the processing limit. This permits microstructuring.

Since a part of the interlayer insulating film 14a as well as the interlayer insulating films 23 and 25 on the Al wiring 15 has been etched, the ion-implanting can be carried out at low energy of 130 keV to 160 keV. This prevents the lateral diffusion of implanted ions, and hence permits the ion-implanting with higher accuracy.

Through the steps described above, the mask ROM with a desired program is completed.

Now referring to the drawings, an explanation will be given of a fourth embodiment of this invention.

The feature of this invention resides in that in the step of ion-implanting impurities so that a desired element is depleted to structure them ask ROM, the ion-implanting is carried out for ROM write using a photoresist having various kinds of opening diameters.

Figure 7A:
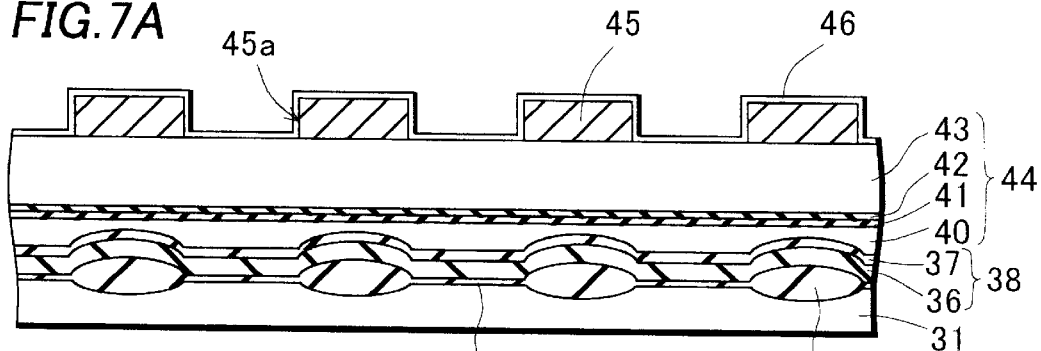
FIGS. 7A to 7C are sectional views for explaining a method of manufacturing a semiconductor device according to the fourth embodiment of this invention.
Figure 7B:
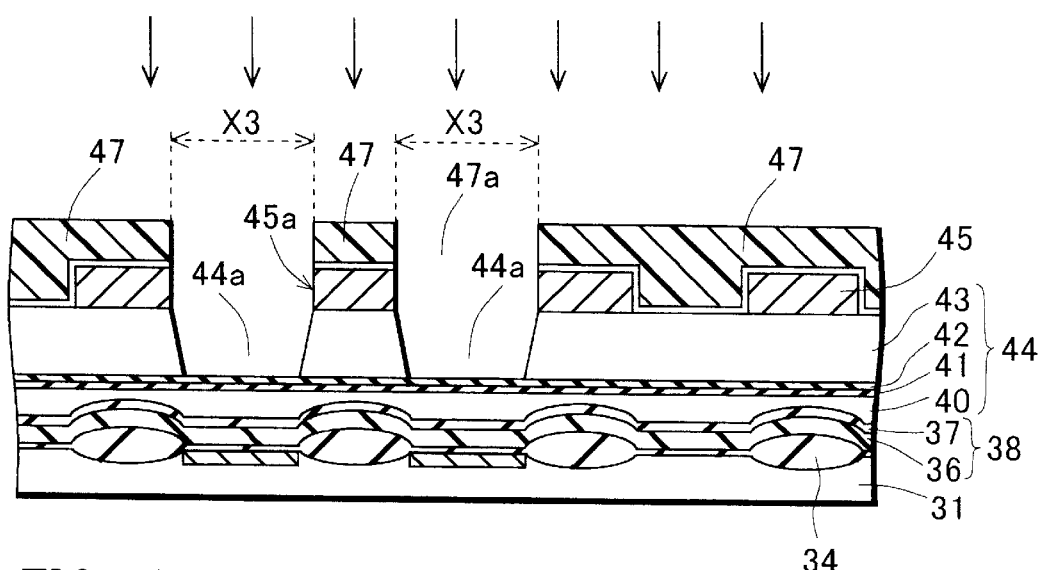
Figure 7C:
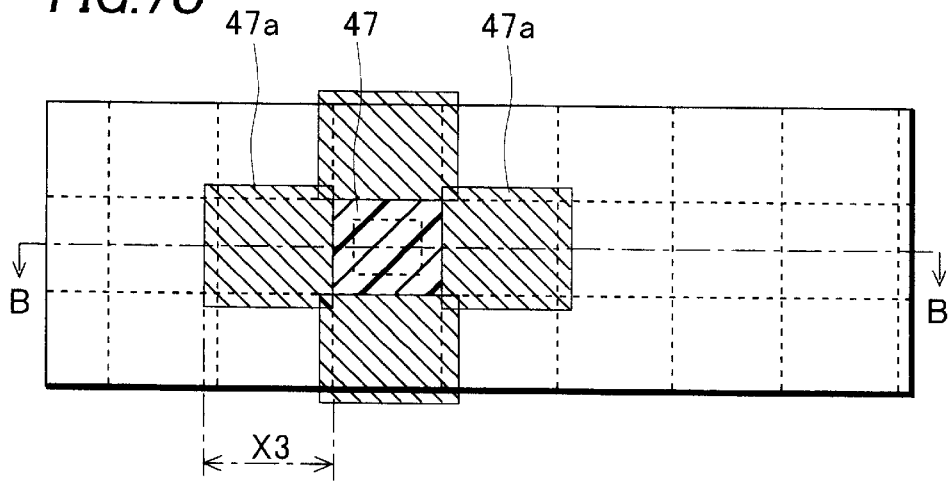

Specifically, as seen from FIG. 7C, above the regions where impurity ions are to be implanted in the adjacent elements, openings are made so as to have a smaller diameter (first opening diameter X3). On the other hand, as seen from FIG. 8B, where ion-implantation is to be carried out for the element at an individual position, an opening is made so as to have a larger diameter (second opening diameter X4) than the first opening diameter.

Using as a mask the photoresist 47 with openings 47a and 47b having the first opening diameter and second opening diameter, the interlayer insulating film 44 is etched to make openings 44a and 44b. Therefore, ion-implantation is carried out to write information.

Thus, where the information is to be written into the element at an individual position, the larger opening diameter is adopted.

Where the information is to be written into the adjacent elements, the smaller opening diameter is adopted. For this reason, unlike the background art, in the element region at the individual position, poor write of information due to incomplete etching of the interlayer insulating film can be inhibited. In the adjacent element regions, unlike the background art, it is possible to prevent the photoresist on the Al wiring located above the regions to be ion-implanted which are overlapped from being excessively thinned owing to the overlapping margins of the opening diameters when the openings are made, thereby inducing the fall-down of the photoresist. Thus, the manufacturing process of the mask ROM can be stabilized.

The respective steps will be explained below.

Figure 6A:
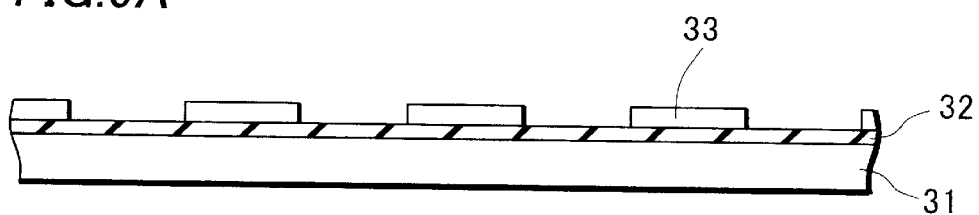
FIGS. 6A to 6C are sectional views for explaining a method of manufacturing a semiconductor device according to a fourth embodiment of this invention.

Step 1: As seen from FIG. 6A, like the step 1 in the conventional manufacturing process and step 1 in the first embodiment, a pad oxide film 32 is formed on a semiconductor substrate 31 and a silicon nitride film 33 having openings is formed thereon.

Figure 6B:
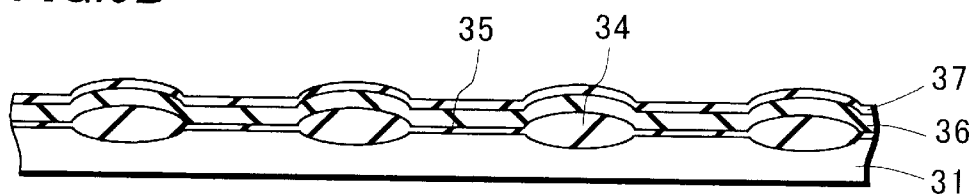

Step 2: As seen from FIG. 6B, using the technique of LOCOS with the silicon nitride film 33 formed on the semiconductor substrate 31 as a mask, the semiconductor substrate 31 is oxidized to form element isolation films 34.

Next, the pad oxide film 32 and the silicon nitride film 33 are removed, and using the technique of thermal oxidation, a gate insulated film 35 having a thickness of 14 nm to 17 nm is formed. Using the technique of CVD, a poly-Si film having a thickness of 100 nm is formed, and phosphorus is doped to form an N-type conductive film 36.

Further, a silicide film 37 of refractory metal such as tungsten having a thickness of 150 nm is formed. The silicide film 37, which constitutes a gate electrode together with the conductive film 36, serves to reduce the electric resistance of the gate electrode and protect the gate electrode as described later.

Figure 6C:
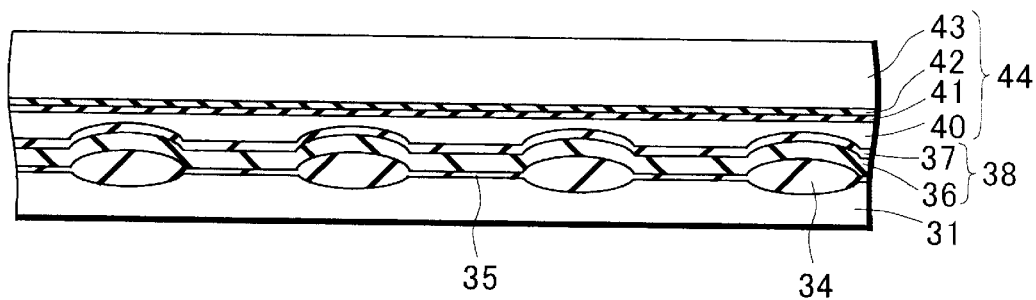

Step 3: As seen from FIG. 6C, the conductive film 36 and the silicide film 37 are etched in lengthy strips in a direction orthogonal to the element isolation films 34 (it should be noted that the etched region, which is in parallel to the paper face, is not illustrated) to form gate electrodes 38, which serve as word lines.

Next, using the gate electrodes 38 as a mask, P-type impurities such as boron are ion-implanted to form a source region and a drain region (which are not illustrated since they are formed below both ends of the gate electrode in a direction perpendicular to the paper face).

Through the process described above, memory cell transistors arranged in a matrix shape are formed.

An interlayer insulating film 44 having a thickness of 600 nm and including a silicon oxide film 40, a silicon nitride film 41, a poly-Si film 42 and silicon oxide film 43 is formed on the entire surface by the technique of CVD. Now, the poly-Si film 42 serves as an etching stopper when the interlayer insulating film 44 is etched as described later.

Step 4: As seen from FIG. 7A. a metallic film of an Al film is formed on the interlayer insulating film 44. The metallic film is patterned to form Al Wirings 45 which serve as bit lines.

Until this step, the manufacturing process can be carried out irrespectively of what program should be written in the memory cell transistors. For this reason, the wafers can be previously manufactured. In this case, in order to protect the metallic wiring layer and prevent its corrosion, a protection film 46 of e.g. a thin silicon oxide film having a thickness of about 50 nm is formed on the entire surface.

Step 5: At the time when a program to be written is determined on receipt of a request from a customer, as seen from FIG. 7B, a photoresist 47 having a thickness of about 1000 nm is formed on the entire surface. The photoresist thus formed is subjected to light exposure and development to form openings 47a in the regions above prescribed memory cells. In this case, the opening 47a is made to have a larger area than that of the region to be ion-implanted so that the edges 45a of the Al wiring 45 are exposed. Next, using the photoresist 47 and the Al wiring 45 as a mask, the interlayer insulating film 44 is etched by a prescribed amount to form openings 44a.

Figure 8A:
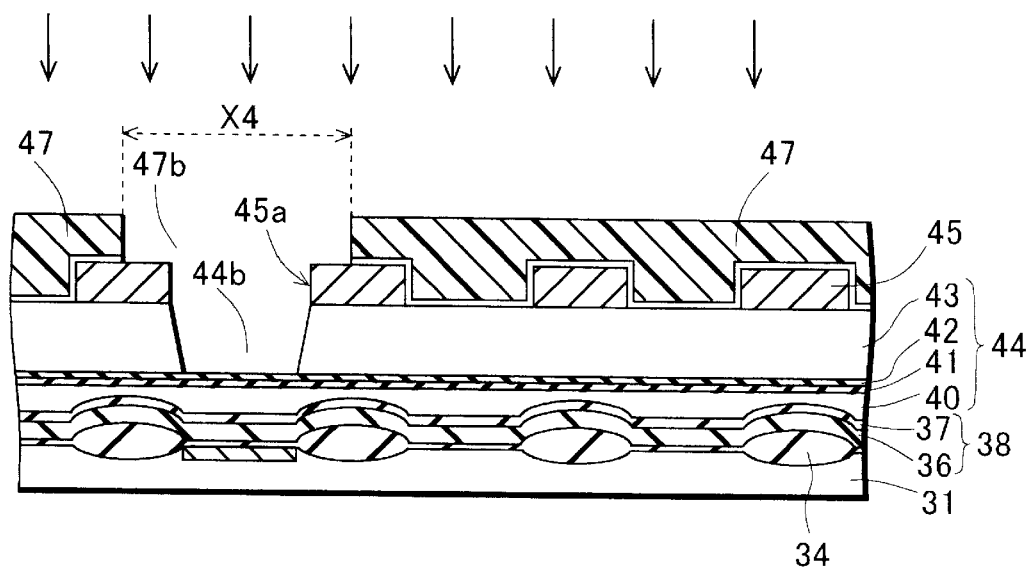
FIGS. 8A and 8B are sectional views for explaining a method of manufacturing a semiconductor device according to the fourth embodiment of this invention.
Figure 8B:
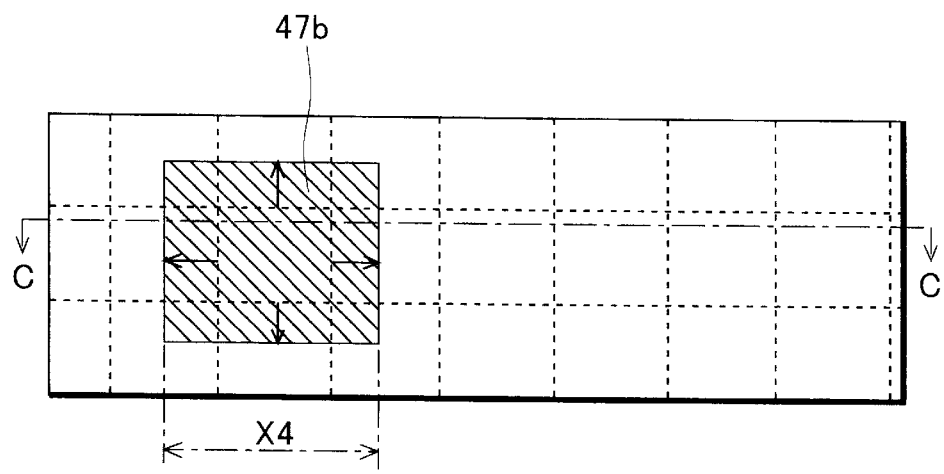
Figure 9A:
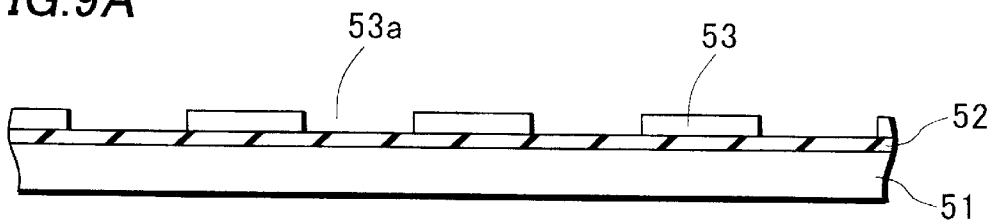
FIGS. 9A to 9D are sectional views for explaining a conventional method of manufacturing a semiconductor device.
Figure 9B:
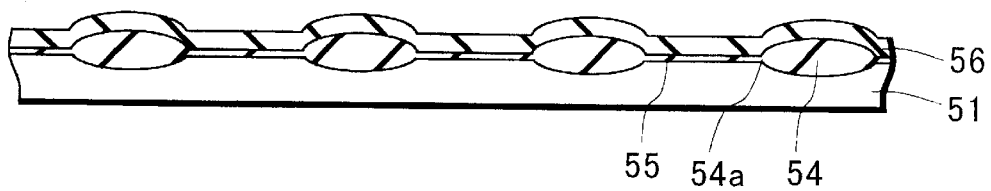
Figure 9C:
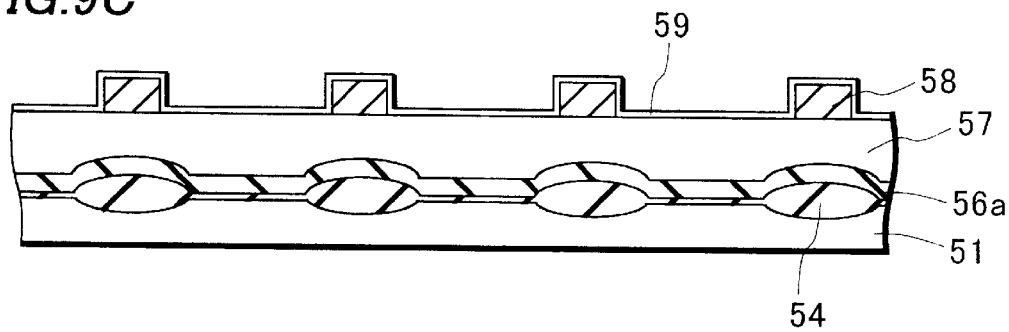
Figure 9D:
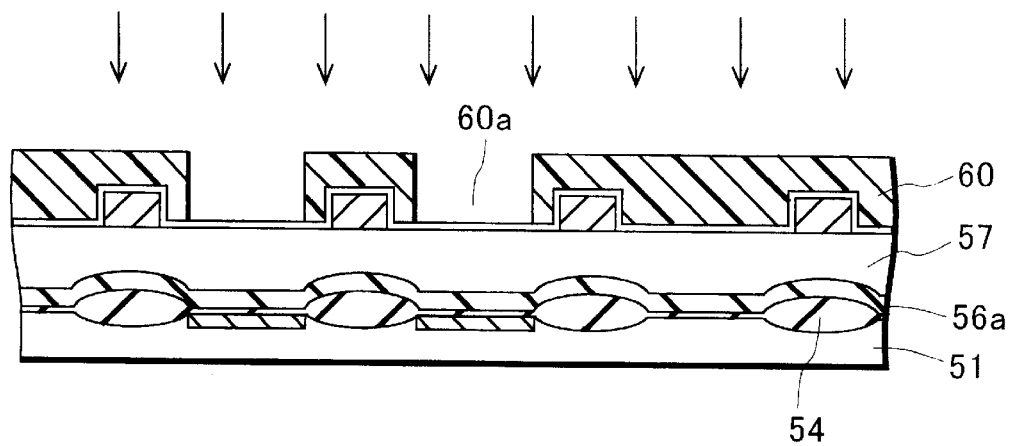
Figure 10:
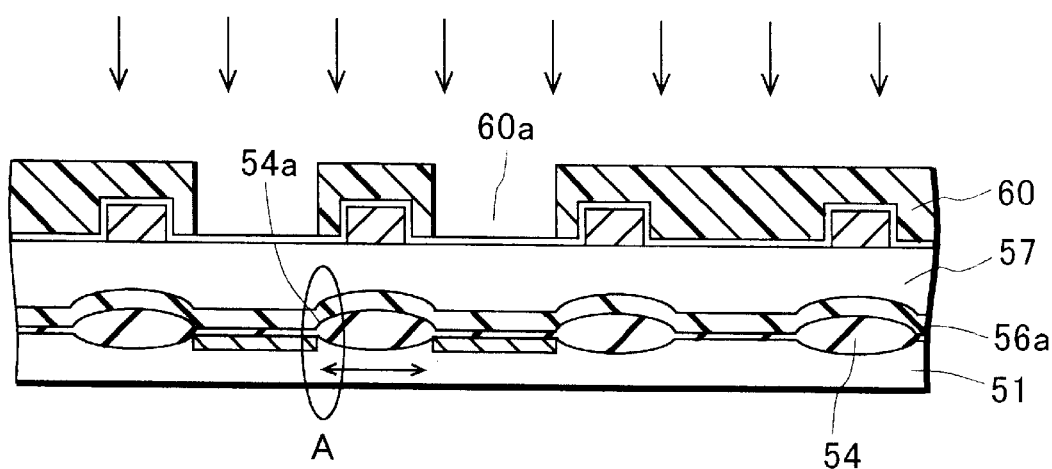
FIG. 10 is a sectional view for explaining the first problem of a method of manufacturing a conventional semiconductor device.
Figure 11A:
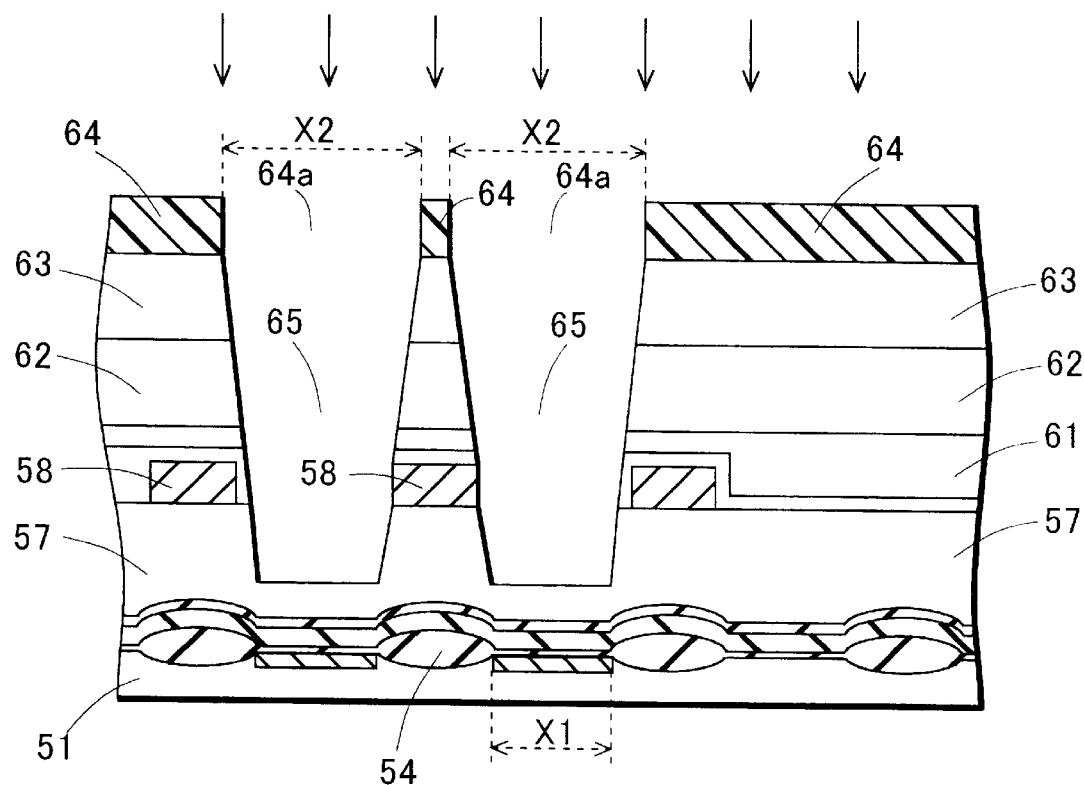
FIGS. 11A and 11B are sectional views for explaining the second problem of a method of manufacturing a conventional semiconductor device.
Figure 11B:
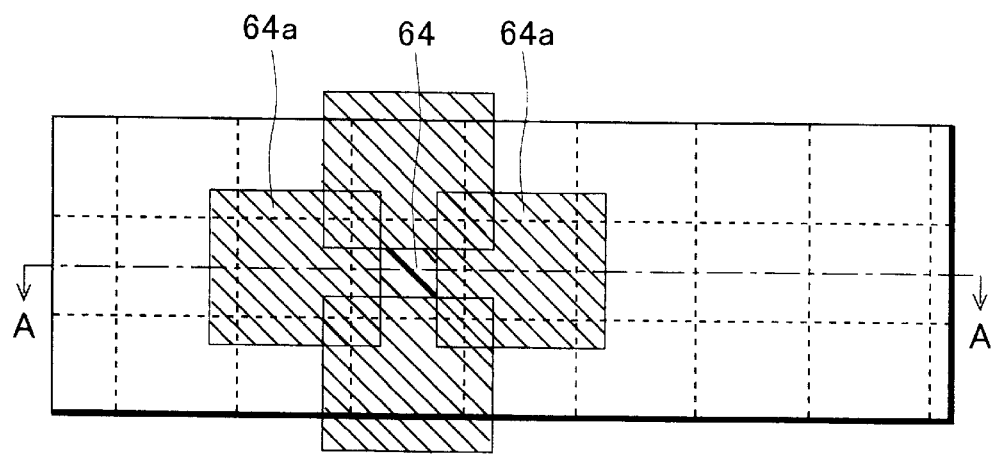

On the other hand, as seen from FIG. 8A, where ion-implantation is to be carried out for the element region to be impurity-ion-implanted at an individual position, the interlayer insulating film 44 is etched through an opening 47b, which has a second diameter X4 larger than the diameter X3 of the first opening formed in the photoresist 47 as shown in FIG. 8A, to form an opening 44b so that the edges 45a of the Al wiring 45 are exposed.

Incidentally, this etching is dry etching in which the interlayer insulating film 44 is left by a thickness of 100 nm from the upper surface of the gate electrode. In this case, the poly-Si film 42 serves as an etching stopper.

P-type impurities such as boron are ion-implanted from the openings 44a and 44b into the semiconductor substrate 31 beneath the gate electrode 38 so that predetermined memory cell transistors are depleted. Thus, the threshold voltages of the memory cell transistors are lowered so that a ROM data is written.

In this way, in accordance with this embodiment, the ROM data is written through the openings 44a which are made above the regions where impurity ions are to be implanted in the adjacent elements so as to have the first diameter X3 smaller than the second diameter X4 as shown in FIG. 7C and the opening 47b which is made above the region where impurity ions are to be implanted in the element at an individual position so as to have a larger diameter (second opening diameter X4) than the first opening diameter X3.

Accordingly, above the regions where impurity ions are to be implanted in the adjacent elements, since the diameter of the opening 47a is made smaller than the diameter of the opening 47b, unlike the background art, the photoresist for etching of the interlayer insulating film can be prevented from being thinned to avoid the fall-down of the photoresist. Above the region(s) where impurity ions are to be implanted in the element(s) at an individual position, since the diameter of the opening 47b is made larger than the diameter of 47a, unlike the background art, poor information write due to the etching remainder of the interlayer insulating film can be inhibited.

In this embodiment, as shown in FIG. 7C, by retracting the face(s) of the opening in contact with a portion of the photoresist surrounded by the adjacent element regions from the portion of the photoresist, the thinning of the photoresist due to overlapping of the openings is reduced. By placing the face(s) of the opening not in contact with the portion of the photoresist as well as the background art, the poor write of information due to the etching remainder is avoided.

Incidentally, as an example of implanting impurity ions in the adjacent elements, this embodiment explains the case where ROM write is carried out for the element regions at four points which encircle the four sides of the photoresist 47. However, the ROM write can be carried out in the same manner for the adjacent element regions which encircle the two or three sides of the photoresist.

Through the process described above, the mask ROM with a desired program written is completed.

It should be noted that the technical idea of this invention can be easily applied to the case where a larger number of metallic wirings are formed.

Further, in the step 3 of each embodiment, the gate electrode can be formed in any manner of forming a poly-Si film, patterning the poly-Si, and forming a silicide film on the poly-Si film.

Further, in each of the embodiments, although the P-type semiconductor substrate was used, an N-type semiconductor substrate or a well region on the semiconductor substrate may be used.

Moreover, in each of the embodiments described above, the program was written in a manner of a depletion ion-implanting of lowering the threshold voltage, but can be also written in a manner of boosting the threshold value.

Additionally, in the step of exposing the edges of the metallic wiring in the step 3, where the elements to be program-written are adjacent, the metallic wiring within the regions to be program-written may be entirely exposed. Namely, by etching away the photoresist 17 located above the adjacent element regions, an inconvenience of the fall-down of the photoresist and the interlayer insulating film due to the thinning of the photoresist can be avoided.

Further, the application filed of this invention should not be limited to the method of writing a program in the mask ROM. This invention can be applied to various products which experience the step of implanting impurity ions using a photoresist as a mask, or using the photoresist and a metallic wiring as the mask.

In accordance with this invention, since impurity ions are implanted in a surface layer using a metallic wiring with higher processing accuracy, the impurity ions of an appropriate amount can be implanted into an appropriate position.

Since this invention is applied to an ion implanting step for writing information in a method of manufacturing a mask ROM, the impurity ions are prevented from being implanted beneath the element isolation film, thereby inhibiting poor element isolation.

Further, where impurity ions are implanted in the adjacent elements using as a mask the photoresist and metallic wiring, no photoresist is caused to remain on the metallic wiring above the regions of the adjacent elements. For this reason, where the interlayer insulating film is etched using the photoresist as a mask, the photoresist and interlayer insulating film do not fall down, which permits an operation stabilized in process.

Further, since the ion-implantation is carried out after the interlayer insulating film has been etched by a prescribed amount using the metallic wiring as a mask, the energy of implanting ions can be suppressed to a low level so that the lateral diffusion of the ions and poor element isolation can be inhibited.

Further, in accordance with this invention, in the process having a step of implanting ions using as a mask the photoresist or both the photoresist and the metallic wiring, the opening of the photoresist is caused to have a larger diameter where the information is to be written into the element at an individual position, and is caused to have a smaller diameter where the information is to be written into the adjacent elements. For this reason, unlike the background art, in the element region at the individual position, poor write of information due to incomplete etching of the interlayer insulating film can be inhibited. In the adjacent element regions, unlike the background art, it is possible to prevent the photoresist above the regions where the ion-implanting regions are overlapped from being thinned, thereby inhibiting the fall-down of the photoresist and the interlayer insulating film when the interlayer insulating film is etched using the photoresist as a mask. This permits an operation stabilized in process.

What is claimed is:

1. A method of manufacturing a semiconductor device comprising:

providing a gate insulating film over a semiconductor substrate;

providing a gate electrode over the gate insulating film:

providing source/drain regions beside said gate electrode;

providing an interlayer insulating film over said gate electrode;

providing a metallic wiring that serves as a bit line over the interlayer insulating film and laid perpendicularly across said gate electrode; and implanting impurity ions in said substrate by using both said metallic wiring and a photoresist appropriately disposed as a mask, wherein no photoresist is provided on the metallic wiring when the impurity ions are implanted at adjacent sides of the metallic wiring.

2. A method of manufacturing a semiconductor device comprising:

providing a gate insulating film over a semiconductor substrate;

providing a gate electrode over the gate insulating film;

providing source/drain regions beside said gate electrode;

providing an interlayer insulating film over said gate electrode;

providing a metallic wiring that serves as a bit line over the interlayer insulating film;

implanting impurity ions in a surface layer of said substrate by using both said metallic wiring and a photoresist appropriately disposed as a mask;

wherein the photoresist has an opening to implant the impurity ions at adjacent sides of the metallic wiring.

3. The method of manufacturing a semiconductor device according to claim 2, further comprising:

providing said metallic wiring as a multiple layer structure; and removing the interlayer insulating film by using the photoresist as a mask to expose the metallic wiring at a lowermost layer.

4. The method of manufacturing a semiconductor device according to claim 2, wherein the impurity ions are implanted to write information for each of elements constituting a mask ROM.

5. A method of manufacturing a semiconductor device comprising:

providing a gate insulating film over a semiconductor substrate;

providing a gate electrode over the gate insulating film;

providing source/drain regions beside said gate electrode;

providing an interlayer insulating film over said gate electrode;

providing a metallic wiring that serves as a bit line over the interlayer insulating film;

implanting impurity ions in said substrate by using both the metallic wiring and a photoresist as a mask, wherein the photoresist has a larger opening for a single region to be ion-implanted than each of the openings for two adjacent regions to be ion-implanted separated by the metallic wiring.

6. The method of manufacturing a semiconductor device according to claim 5, further comprising:

providing said metallic wiring as a multiple layer structure, removing the interlayer insulating film by using the photoresist as a mask to expose the metallic wiring at a lowermost layer.

7. The method of manufacturing a semiconductor device according to claim 5, wherein said ions are implanted to write information for each of elements constituting a mask ROM.

8. A method of manufacturing a semiconductor device comprising:

providing alternately an element isolation film and a gate insulating film over a semiconductor substrate;

providing a gate electrode on the semiconductor substrate perpendicularly across the element isolation film and the gate insulating film;

providing source/drain beside said gate electrode;

providing an interlayer insulating film over said gate electrode;

providing a metallic wiring disposed over the interlayer insulating film and above said element isolation film, said metallic wiring having a same width as the element isolation film:

implanting impurity ions in said substrate by using both said metallic wiring and a photoresist as a mask, wherein no photoresist is provided on the metallic wiring when the impurity ions are implanted at adjacent sides of the metallic wiring.

9. The method of manufacturing a semiconductor device according to claim 8, wherein the metallic wiring serves as a bit line.

* * * * *